United States Patent [19]

Rae

[11] 4,042,883
[45] Aug. 16, 1977

[54] AUTOMATIC NOISE LIMITER

[75] Inventor: James Wilson Rae, Schaumburg, Ill.

[73] Assignee: Motorola, Inc., Schaumburg, Ill.

[21] Appl. No.: 670,503

[22] Filed: Mar. 25, 1976

[51] Int. Cl.² .............................................. H04B 1/10
[52] U.S. Cl. ...................................... 325/477; 325/482
[58] Field of Search ........ 325/482, 480, 484, 473–477;
328/165, 167; 307/237; 178/DIG. 12

[56] References Cited

U.S. PATENT DOCUMENTS

| | | | |
|---|---|---|---|
| 2,422,976 | 6/1947 | Nicholson, Jr. | 325/482 |
| 2,446,565 | 8/1948 | Wasmansdorff | 325/482 |
| 2,453,958 | 11/1948 | Andresen | 325/482 |
| 2,802,939 | 8/1957 | Klehfoth | 325/477 |
| 3,064,197 | 11/1962 | Ek | 325/482 |
| 3,102,237 | 8/1963 | Elliott | 325/482 |
| 3,493,871 | 2/1970 | Mason et al. | 325/477 |

Primary Examiner—Robert L. Griffin
Assistant Examiner—Marc E. Bookbinder
Attorney, Agent, or Firm—James W. Gillman; Victor Myer; James P. Hamley

[57] ABSTRACT

The output from a peak detector of a conventional radio receiver includes a recovered audio signal and a DC level. The disclosed noise limiter processes the detector output through both low pass and high pass filters. The low pass filter produces a DC signal representative of both the detector DC level and the recovered audio signal level. The high pass filter passes only the recovered audio signal. A semiconductor diode connects between the filter outputs, and the output of the noise limiter. For peak detector levels at, or below the 100% modulation level the diode is forward biased and passes the audio signal to the noise limiter output for further receiver processing. Peak detector levels exceeding 100% modulation, such as noise, reverse bias the diode whereby the audio signal is blocked from subsequent receiver stages.

5 Claims, 1 Drawing Figure

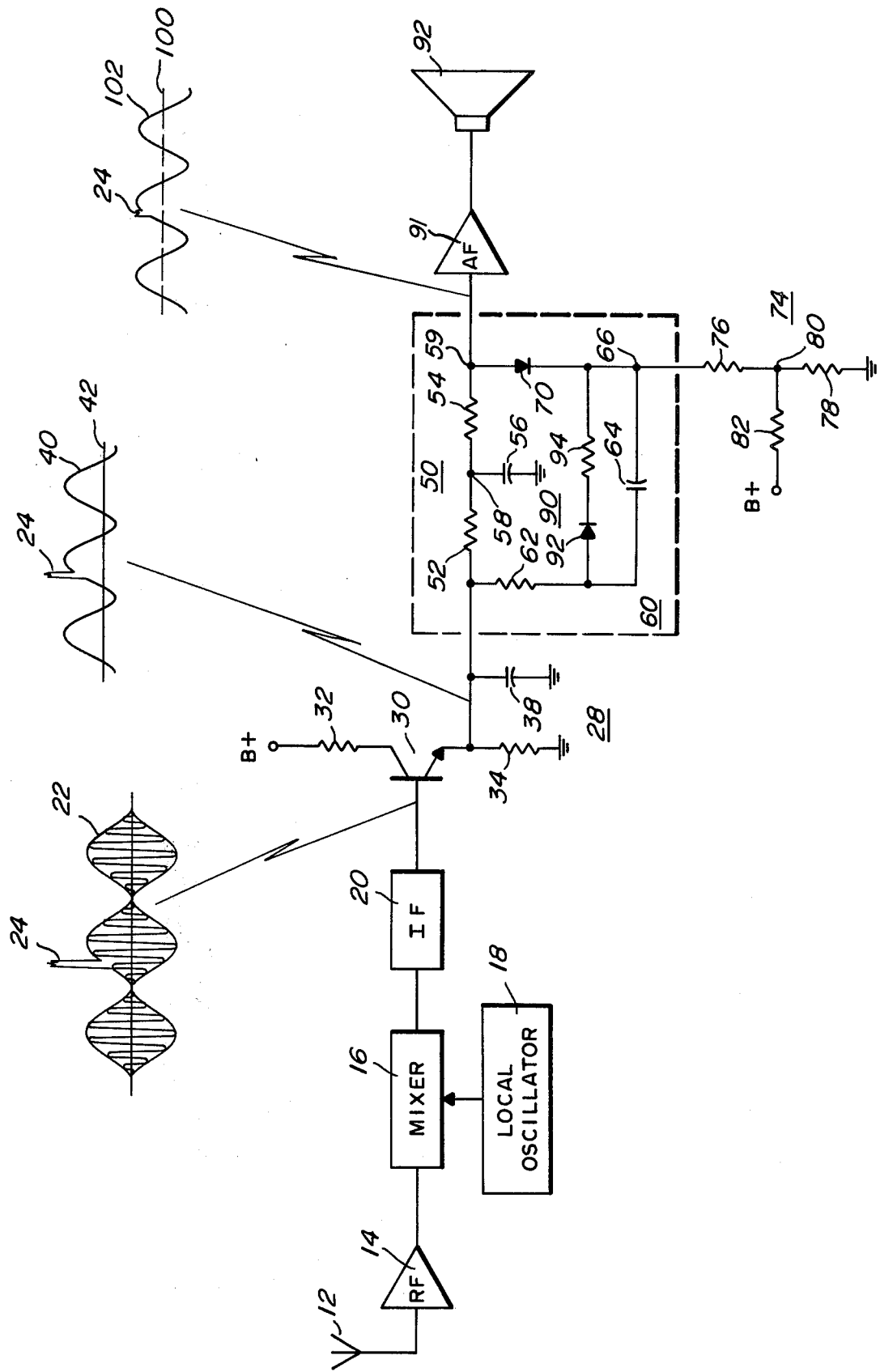

AUTOMATIC NOISE LIMITER

BACKGROUND OF THE INVENTION

This invention pertains to the communication art and, in particular, to an automatic noise limiter for use in a radio receiver.

Automatic noise limiter circuits, especially those used in radio receivers, are well known in the communication art. In radio receiver applications the function of the noise limiter is to detect noise signals, e.g. those signals exceeding a predetermined threshold level, and limit the noise signals to a given level. Thus, the audio effect of the noise limiter is to minimize noise impulses or bursts which would otherwise be reproduced by the receiver.

Prior art noise limiter circuits, especially those used in amplitude modulated receivers, have proved less than satisfactory. Generally, such noise limiter circuits have either been very sophisticated and, therefore, expensive to manufacture requiring large numbers of costly components, or they have been very primitive both in structure and in operation. Ideally, an automatic noise limiter circuit for use in an amplitude modulated receiver should limit all signals which exceed a given percent modulation figure, commonly 100% modulation, since this represents the known level of audio broadcast from the transmitter. Heretofore, inexpensively and easily manufactured noise limiter circuits for amplitude modulated receivers have not adequately provided limiting in response to the desired percent modulation level.

SUMMARY OF THE INVENTION

It is an object of this invention, therefore, to provide an improved automatic noise limiter circuit which is both precise in operation yet relatively inexpensive to manufacture.

It is a particular object of this invention to provide the above described automatic noise limiter circuit for use in an amplitude modulated radio receiver.

Briefly, according to the invention, the automatic noise limiter circuit may be used in combination with a high frequency receiver. The receiver produces a radio frequency signal which is amplitude modulated by an audio signal. A peak detector rectifies and filters the amplitude modulated high frequency signal to both recover the audio signal and to produce a direct current signal having a level representative of the magnitude of the high frequency signal. The peak detector signal is low pass filtered producing a direct current level representative of both the direct current signal from the peak detector and the level of the recovered audio signal. The peak detector output is also high pass filtered whereby the high pass filter passes to its output a predetermined portion of the recovered audio signal while blocking the peak detector direct current signal. A semiconductor switch, preferably a semiconductor diode, senses both the direct current level produced by the low pass filter and the recovered audio signal passed by the high pass filter and, in response to a predetermined relationship between the two signals, passes the recovered audio signal to the noise limiter output terminal for further receiver processing. Preferably, the switch is designed to pass only those audio signals corresponding to radio frequency signals having 100% modulation or less. Biasing circuitry biases the switch to zero bias in te absence of a received high frequency signal. The biasing circuitry includes temperature compensating circuitry to maintain the bias over ambient temperature fluctuations.

BRIEF DESCRIPTION OF THE DRAWING

The single FIGURE is a schematic diagram of the preferred construction of the automatic noise limiter circuit when used in combination with a conventional amplitude modulated radio receiver.

DESCRIPTION OF THE PREFERRED EMBODIMENT OF THE INVENTION

The FIGURE illustrates, in schematic diagram form, a conventional receiver shown in combination with the preferred embodiment of the automatic noise limiter circuit. The receiver includes an antenna 12 which feeds to an RF amplifier 14. The RF amplifier normally includes tuning circuitry to provide selectivity at that radio frequency to which the receiver is tuned. The RF amplifier feeds to one input of a mixer 16, whose remaining input connects to a local oscillator 18. The mixer 16 operates in a conventional manner to convert the received RF signal from the RF amplifier 14 to an intermediate frequency. The converted RF signal from the mixer 16 is filtered and amplified, in the well known manner, in the IF amplifier and filter stage 20.

The signal out of IF amplifier 20 is an amplitude modulated signal shown as waveform 22. Illustrated is a 100% modulated waveform wherein the IF signal assumes an envelope determined by an audio modulating signal. For purposes of illustration, the waveform is shown carrying a noise impulse 24. The impulse 24 was not transmitted by the transmitter rather the pulse 24 was introduced via the communication medium.

The amplitude modulated IF signal 22 is applied to a peak detector 28 comprised of a bipolar transistor 30 having the collector load resistor 32 coupled to a bias or B+ potential, and an emitter resistor 34 coupled to ground potential.

Amplitude modulated waveform 22 causes the peak detector transistor 30 to be driven into a non-linear region of operation. In this mode the transistor effectively becomes a halfwave rectifier since positive going excursions of the input waveform signal 22 caused the transistor to conduct, charging a filter capacitor 38 to the peak IF voltage, minus the base to emitter drop of transistor stage 30. The value of emitter resistor 34 and of any subsequent stage resistors connected to the emitter of transistor 30 are chosen to discharge filter capacitor 38 with a time constant of 0.2 milliseconds. Thus the total resistance acting on capacitor 38 causes the voltage at the output of the peak detector to filter off RF frequency signals ad reproduce frequencies at 5 kilohertz and less. This is illustrated as waveform 40 wherein the RF signals from the modulated waveform 22 are filtered out, leaving the recovered audio signal, a portion of the impulse 24, and a direct current signal 42 having a level representative of the magnitude of the radio frequency signal 22.

The output waveform 40 from the peak detector stage 28 is processed through a low pass filter stage 50 which is comprised of a pair of series resistors 52, 54 with a shunt capacitor 56 connected therebetween. The values of resistors 52, 54 are chosen to provide the proper discharge to capacitor 38 in conjunction with resistor 34 as mentioned above, and to act in conjunction with the capacitor 56 to produce, at the junction 58 of the resistors 52, 54 and capacitor 56, a direct current signal having a level representative of both the DC level 42, and AC recovered audio signal level 40 from the peak detector stage 28.

The output of the peak detector stage 28 is also passed through a high pass filter 60 comprised of a resistor 62 and a series connected capacitor 64. The high pass filter passes to its output terminal 66 the recovered audio signal 43 from peak detector 28, while the capacitor 64 blocks the DC component 42 of the detector 28 output.

Coupled between the output terminal 59 of the low pass filter 50 and the output terminal 66 of the high pass filter 60 is a semiconductor rectifying diode 70 having its anode connected to terminal 59 and its cathode to terminal 66. The diode 70 acts as a switch whereby when the output voltage at terminal 59 exceeds the voltage of terminal 66 by a predetermined threshold level the diode 70 is forward biased and acts as a low impedance. When the bias across diode 70 is less than the threshold the diode is reverse biased and exhibits a very high impedance.

Also coupled to the cathode of diode 70 is a bias circuit 74. Bias circuit 74 is comprised of series connected resistors 76, 78 connected at a common point 80 with the free end of resistor 78 connected to ground potential. A third resistor 82 couples from the DC bias B+ source to the common terminal 80. The value of the resistors 76, 78, and 82 in the bias circuit 74 are selected such that in the absence of an IF signal appearing from the radio receiver to the peak detector stage 28 the DC voltage bias across diode 70 is zero. Thus, the bias circuit 74 maintains the diode 70 in a high impedance stage in the absence of a radio frequency signal.

A temperature compensating network 90 comprised of a diode 92, identical to diode 70, ad a resistor 94. The compensating circuit 90 wires in parallel with the capacitor 64 the high pass filter 60.

In operation, as the radio frequency signal input to the peak detector stage 28 increases, the average DC voltage level, and the peak audio recovered audio level out of the peak detector increase in proportion to one another. The average DC level from the peak detector 28 causes a current to flow through resistors 52, 54, diode 70, and resistor 76 as well as resistors 62, 94 and diode 92, thus forward biasing diode 70 to a low impedance state. The recovered audio signal from the detector 28 is predeterminedly attenuated by resistors 62 and 76 and is applied to the high pass filter 60 to the cathode of diode 70. The attenuation provided by resistor 62 and 76 is such that under 100% modulation of the RF carrier signal the peak audio voltage appearing at the output terminal 66 of the high pass filter 60 equals the direct current voltage at common connection 58 in the low pass filter 50. Thus, for signals having above 100% modulation diode 70 is reverse biased and in a high impedance state. For signals at 100% modulation, or therebelow, diode 70 is biased to a conductive state and the recovered audio signal appearing at the high pass filter output 66 couples through the diode 70 to the output of the low pass filter 59 and thereafter to the output of the automatic noise limiter circuit to be amplified by an audio amplifier 91 and subsequently transduced to audibility by a speaker 92.

For signals exceeding 100% modulation, such as the noise impulse signal 24, diode 70 becomes reverse biased thereby limiting the output voltage level to the maximum allowable audio signal at 100% modulation. This is shown in waveform 100 wherein the audio signal 102 is passed on to the audio amplifier 91 and speaker 92 and the noise impulse 24 is shown limited in magnitude to the peak audio level. Thus the limiting circuit automatically clips any noise impulses to the maximum allowed audio signal at 100% modulation.

Temperature compensating circuit 90 controls the quiescent bias on diode 70 whereby the proper zero bias is applied to diode 70 under quiescent conditions over a wide range of temperatures. For example, with increasing temperature the threshold voltage of diode 70 decreases whereby in the absence of an RF applied signal the diode might be biased to a low impedance state. To compensate for this, diode 92, having an identical characteristic to that of diode 70, also decreases in threshold voltage in exactly the right proportion to maintain the bias at the cathode of diode 70 at a zero biased state. Thus a change in the threshold voltage of diode 70 due to ambient tmeperature variation does not affect the performance of the system. Resistors 62, 94 are chosen to equal resistors 52, 54 such that identical bias currents flow through each of the diodes 70, 92 thereby maximizing the temperature tracking characteristic of the diodes.

In summary, an improved automatic noise limiter circuit has been described which uses a limited number of inexpensive components to achieve a high precision of automatic noise limiting.

While a preferred embodiment of the invention has been described in detail, it should be understood that many modifications and variations thereto are possible, all of which fall within the true spirit and scope of the invention. For example, whereas the preferred embodiment of the invention operates from the IF amplifier output, it should be understood that the invention operates equally as well from the RF amplifier output directly.

I claim:

1. An automatic noise limiter circuit for use in a radio frequency receiver, the receiver producing a high frequency signal which is amplitude modulated by an audio signal, the automatic noise limiter comprising:

peak detector means for rectifying and filtering the amplitude modulated high frequency signal to recovere the audio signal therefrom and produce a direct current signal representative of the magnitude of the high frequency signal;

low pass filter means for processing the recovered audio signal and the direct current signal from the peak detector means and producing at its output a representative direct current level;

high pass filter means for passing to its output a predetermined portion of the recovered audio signal from the peak detector means, the high pass filter means preventing the peak detector means produced direct current level from passing to its output;

a noise limiter output terminal;

switch means comprising a semiconductor rectifier coupled between the output of the low pass filter and the output of the high pass filter, the rectifier exhibiting a low impedance response to the low filter output exceeding the high pass filter output by a predetermined threshold level, the rectifier otherwise exhibiting a high impedance;

a bias means coupled to the semiconductor rectifier for producing zero bias across said rectifier in the absence of a high frequency signal from the receiver said bias means comprising temperature compensating means for maintaining said rectifier at zero bias over a temperature range in the absence of a high frequency signal from the receiver.

2. The automatic noise limiter circuit of claim 1 wherein the switch means includes means for passing the high pass filtered audio signal to the noise limiter output terminal for all of said audio signals corresponding to 100% or less modulation of the high frequency signal.

3. The automatic noise limiter of claim 1 wherein the low pass filter comprises a "T" network having a pair of series connected resistors with a shunt capacitor therebetween.

4. The automatic noise limiter of claim 1 wherein the rectifier is comprised of a semiconductor diode having its anode coupled to the low pass filter output and its cathode coupled to the high pass filter output, and wherein the anode of the diode couples to the noise limiter output terminal.

5. The automatic noise limiter circuit of claim 4 wherein the high pass filter means includes a means for passing to the cathode of the diode a predetermined portion of the recovered audio signal such that for 100% or less modulation of the high frequency signal the diode exhibits a low impedance.

* * * * *